US 6,756,284 B2

(12) United States Patent
Sharma

(10) Patent No.: US 6,756,284 B2
(45) Date of Patent: Jun. 29, 2004

(54) METHOD FOR FORMING A SUBLITHOGRAPHIC OPENING IN A SEMICONDUCTOR PROCESS

(75) Inventor: Gian Sharma, San Jose, CA (US)

(73) Assignee: Silicon Storage Technology, Inc., Sunnyvale, CA (US)

( * ) Notice: Subject to any disclaimer, the term of this patent is extended or adjusted under 35 U.S.C. 154(b) by 0 days.

(21) Appl. No.: 10/247,400

(22) Filed: Sep. 18, 2002

(65) Prior Publication Data

US 2004/0053475 A1 Mar. 18, 2004

(51) Int. Cl.$^7$ ................................. H01L 21/76
(52) U.S. Cl. ................. 438/424; 438/128; 438/299; 438/587; 438/595; 438/745
(58) Field of Search .................. 438/424, 128, 438/299, 587, 595, 696, 228, 275, 745

(56) References Cited

U.S. PATENT DOCUMENTS

| | | | | |
|---|---|---|---|---|
| 5,004,703 A | * | 4/1991 | Zdebel et al. | |
| 5,096,848 A | * | 3/1992 | Kawamura | |
| 5,308,784 A | * | 5/1994 | Kim et al. | |
| 5,372,968 A | * | 12/1994 | Lur et al. | |
| 5,378,646 A | * | 1/1995 | Huang et al. | 438/128 |
| 5,821,160 A | * | 10/1998 | Rodriguez et al. | |
| 5,843,625 A | * | 12/1998 | Hause et al. | 430/313 |
| 5,866,466 A | * | 2/1999 | Kim et al. | |
| 6,316,807 B1 | * | 11/2001 | Fujishima et al. | |
| 6,362,117 B1 | * | 3/2002 | Houston | |
| 6,365,451 B2 | * | 4/2002 | Havemann | |
| 6,413,802 B1 | * | 7/2002 | Hu et al. | |
| 6,423,475 B1 | * | 7/2002 | Lyons et al. | |
| 6,429,125 B2 | * | 8/2002 | Reinberg | |

OTHER PUBLICATIONS

Office Action dated May 30, 2003 for patent application Ser. No. 10/246,882 for "Hybrid Trench Isolation Technology for High Voltage Isolation Using Thin Field Oxide In A Semiconductor Process"; Examiner: Stanetta D. Isaac; Art Unit 2812.

* cited by examiner

*Primary Examiner*—Matthew Smith
*Assistant Examiner*—Igwe U. Anya
(74) *Attorney, Agent, or Firm*—Gray Cary Ware & Freidenrich LLP

(57) ABSTRACT

A first method of forming a sublithographic opening in a first layer of a first material begins by creating a lithographic opening on the first layer with the lithographic opening being over the location of the desired sublithographic opening. The first material in the first layer is partially removed from the lithographic opening. A sacrificial layer of the same material as the first layer is conformally deposited to fit the contour of the first layer, including over the lithographic opening. The resultant structure is anisotropically etched to etch the sacrificial layer as well as the first layer to form the sublithographic opening within the lithographic opening. A second method to form a sublithographic opening is to deposit a sacrificial layer such as polysilicon. A lithographic opening is created in the sacrificial layer with the lithographic opening being positioned over the location of the desired sublithographic opening. The sacrificial material is removed from the lithographic opening. The sacrificial material is then laterally expanded by converting the sacrificial material to a second sacrificial material, thereby decreasing the size of the lithographic opening to a sublithographic opening. This can be done by converting the sacrificial polysilicon into silicon dioxide. The converted silicon dioxide may then be used as a mask layer to etch the underlying layers.

10 Claims, 4 Drawing Sheets

METHOD FOR FORMING A SUBLITHOGRAPHIC OPENING IN A SEMICONDUCTOR PROCESS

CROSS REFERENCE TO RELATED APPLICATIONS

This application is related to U.S. patent application Ser. No. 10/246,882, filed on even date herewith, entitled "Hybrid Trench Isolation Technology For High Voltage Isolation Using Thin Field Oxide In A Semiconductor Process", inventor Gian Sharma, the disclosure of which is incorporated herein by reference.

TECHNICAL FIELD

The present invention relates to a method of forming a sublithographic opening in a layer of a material in a semiconductor process.

BACKGROUND OF THE INVENTION

Methods of forming a lithographic opening in a layer of a material in a semiconductor process are well known in the art. A lithographic opening is the smallest feature size in a semiconductor process that that process can produce. Thus, for example, in a 0.13 micron process, the smallest opening or feature size that the process can create would be an opening of 0.13 micron in size, which would be the lithographic feature for that process. A sublithographic opening would be an opening having dimensions that are smaller than the smallest feature size available for that lithographic process. Thus, any opening having a dimension less than 0.13 micron in a 0.13 micron process would be a sublithographic opening in a 0.13 micron process.

It is desirable in a lithographic process to form sublithographic openings in certain parts of the semiconductor structure to create a smaller feature size in order to handle problems such as misalignment or the like. In the prior art, it is known to create a sacrificial layer of a first material. A lithographic opening is created in the first layer of sacrificial material forming a lithographic opening therein. A second layer of a second material, different from the first material, is conformally deposited on the first layer. The second layer of the second material is then anisotropically etched until the first layer is reached. This creates spacers made of the second material in the opening in the first layer. The spacers in the opening of the first layer decreases the size of the opening thereby creating a sublithographic opening. The first layer of the first material along with the spacers of the second material is then used as a masking layer to create sublithographic openings in the layers upon which the first layer is deposited. See for example, U.S. Pat. No. 6,362,117. Such a process, however, requires the use of two layers of different materials to form a sacrificial masking layer. See also U.S. Pat. Nos. 6,365,451; 6,413,802; 6,429,125 and 6,423,475 on creation of sublithographic structures in a semiconductor structure.

SUMMARY OF THE INVENTION

A method of forming a sublithographic opening in a first layer of a first material in a semiconductor process comprises creating a lithographic opening on the first layer. The lithographic opening is over the location of the desired sublithographic opening. The first material in the lithographic opening is partially removed. A sacrificial layer is deposited conformally to the contour of the first layer over the first layer including over the lithographic opening. The sacrificial layer is also of the first material. The sacrificial layer and the first layer are anisotropically etched until all the material from the sublithographic opening is etched off to form the sublithographic opening within the lithographic opening.

The present invention also relates to another method of forming a sublithographic opening in a first layer of a first material in a semiconductor process. In the method, a sacrificial layer of a first material is deposited on a first layer. A lithographic opening is created on the sacrificial layer. The lithographic opening is positioned over the location of the desired sublithographic opening. The first material is removed in the lithographic opening. The first material is then laterally expanded by converting the first material to a second material thereby decreasing the size of the lithographic opening to a sublithographic opening. The first layer is then etched using the second material as a masking layer to form the sublithographic opening in the first layer.

DETAILED DESCRIPTION OF THE INVENTION

Figure 1A:
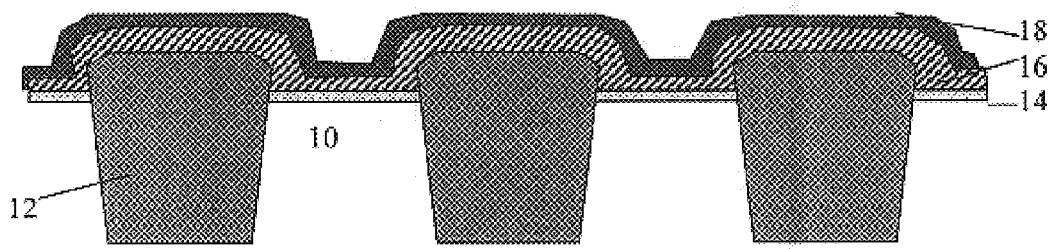
FIGS. 1a–1g are cross-sectional views of a method of the present invention to form a sublithographic opening in a first layer of a first material in a semiconductor process.

Referring to FIG. 1a, there is shown a cross-sectional view of a semiconductor substrate 10, made typically of single crystalline silicon. The substrate 10 has a number of shallow trench isolations 12 provided therein. The process of forming sublithographic openings will be described with regard to FIGS. 1a–1g which shows the formation of a floating gate over the substrate 10. However, it will be understood by those skilled in the art that the present invention is not limited to the formation of floating gates. Rather, the present invention of forming a sublithographic opening can be made in any material irrespective of the presence of trench isolations 12.

A first layer of silicon oxide or silicon dioxide 14 (on the order of 50 angstroms) is formed on a first surface (top surface) of the substrate 10. This can be done, for example, by either Chemical Vapor Deposition or by thermally converting the Silicon to Silicon Dioxide. Eventually, the layer 14 of silicon (di)oxide (as used hereinafter (di)oxide shall refer to both silicon oxide as well as silicon dioxide) serves as the gate coupling oxide. A first layer 16 of polysilicon or amorphous silicon 16 (on the order of 600 angstroms) is deposited on the layer 14 of silicon (di)oxide. This can be done, for example, by plasma enhance deposition method or by high temperature method where compounds of silicon are reduced to silicon. As used hereinafter, Polysilicon will refer to both amorphous silicon as well as polysilicon. Finally, a layer of silicon nitride 18 (on the order of 300 angstroms) is conformally deposited on the first layer 16 of Polysilicon. This can be done, for example, by plasma enhanced deposition method or by high temperature method where compounds of silicon, such as $SiH_4$, $SiH_2Cl_2$ and other gases like $NH_3$ are used to form the layer 18 of silicon nitride. All of the foregoing deposition processes are well known in the art. The resultant structure is shown in FIG. 1a.

Figure 1B:
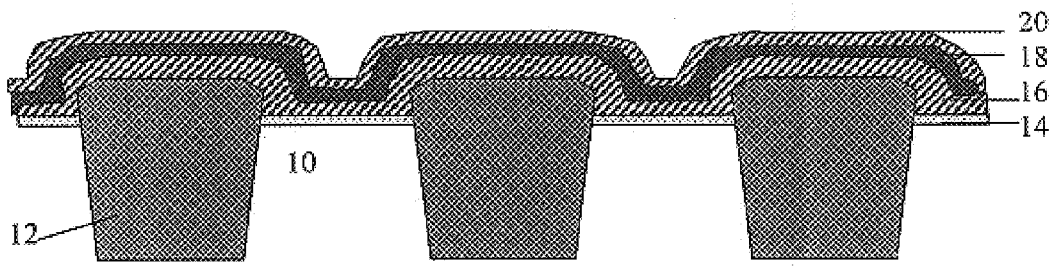

A second layer of Polysilicon 20 (on the order of 450 angstroms) is then deposited on the structure shown in FIG. 1a, on top of the layer 18 of silicon nitride. The resultant structure is shown in FIG. 1b. The second layer 20 of Polysilicon can be deposited by conventional well-known techniques such as reduction of gaseous compounds of silicon.

Photoresist 22 is then applied across the structure of FIG. 1b and lithographic openings 24 are formed therein. The lithographic openings 24 are formed in locations where ultimately the sublithographic openings in the first layer 16 of Polysilicon will be formed. Using well known photoresist exposure and removal techniques, lithographic openings 24 are formed. The resultant structure is formed in FIG. 1c.

Using the photoresist 22 as the mask, the exposed second layer of Polysilicon 20 in the openings 24 are then removed using well known techniques such as RIE anisotropic etch with silicon nitride as the etch stop. The anisotropic etching of the second layer 20 of Polysilicon proceeds until the layer 18 of silicon nitride is exposed. The resultant structure is shown in FIG. 1d.

The photoresist 22 is then removed. This results in the second layer of Polysilicon 20 having the lithographic openings 24. This resultant structure is shown in FIG. 1e.

Figure 1C:
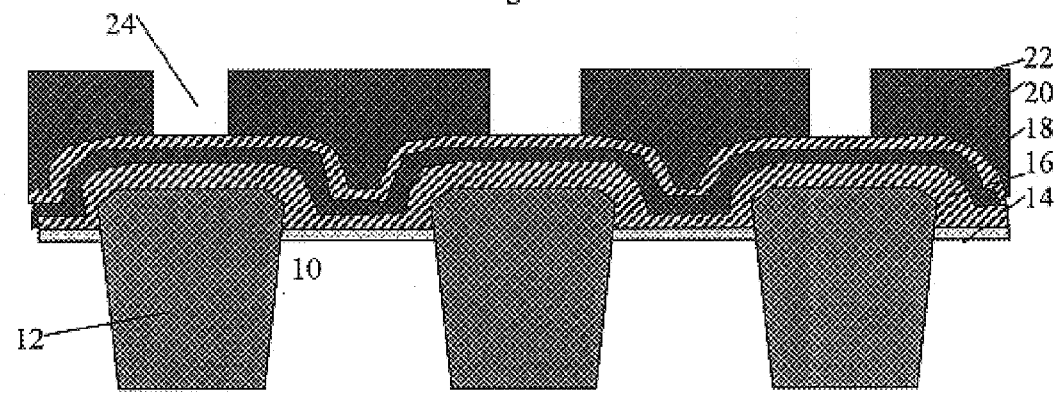
Figure 1D:
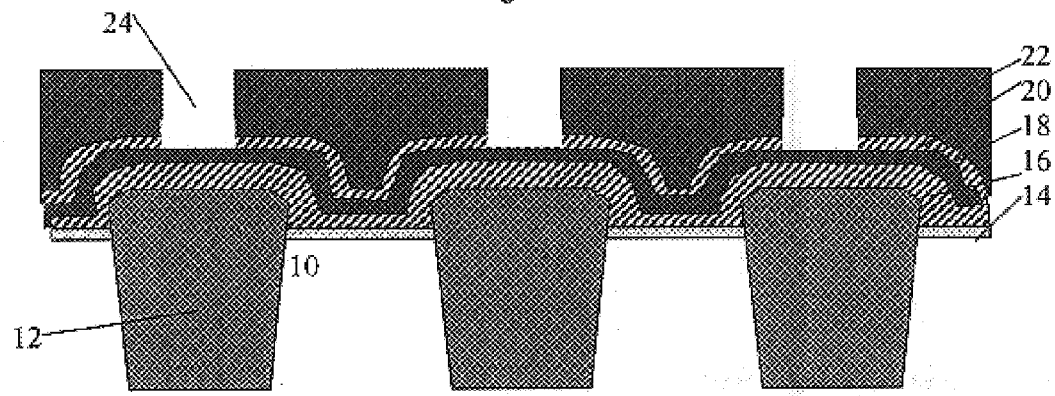
Figure 1E:
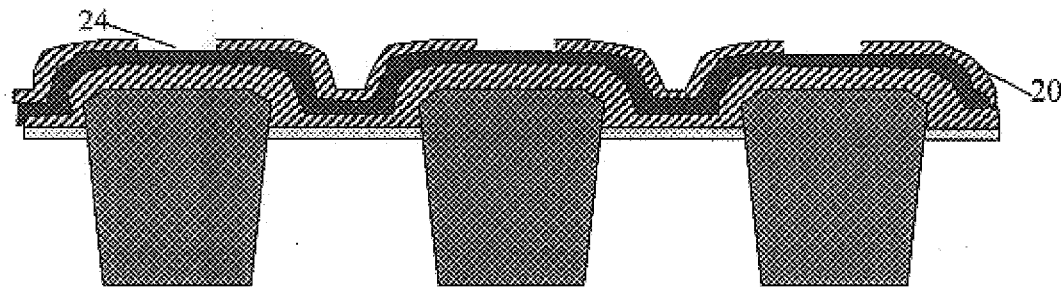
Figure 1F:
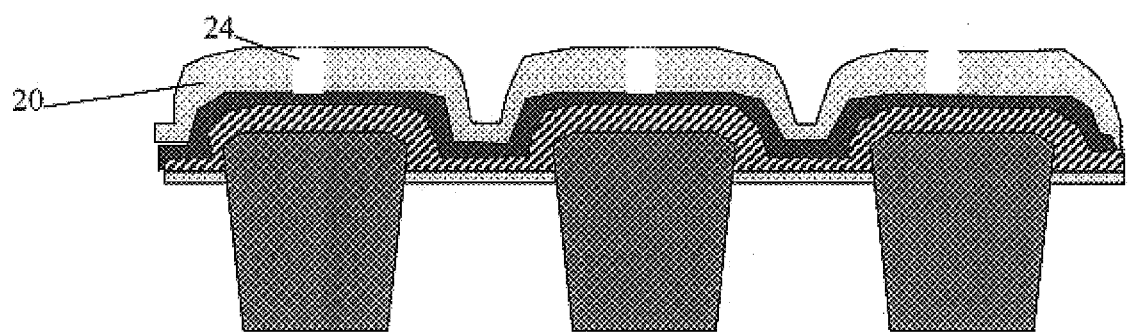

The structure shown in FIG. 1e is then oxidized or placed in an oxidizing atmosphere such as $O_2$ alone or a mixture of $H_2$ and $O_2$. This causes the second layer 20 of Polysilicon to be converted into silicon (di)oxide. As is well known, since silicon (di)oxide has larger molecular size than Polysilicon, the conversion of Polysilicon 20 into silicon (di)oxide causes the spacing or the opening 24 to shrink. This is due to the lateral expansion of the silicon (di)oxide when it is formed. As a result, a sublithographic opening is then created. The resultant structure is shown in FIG. 1f.

Figure 1G:
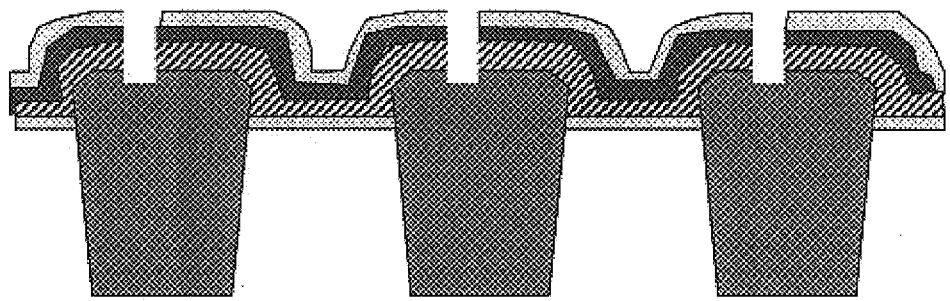

Using the silicon (di)oxide layer 20 as the masking layer, the layer 18 of silicon nitride and the layer 16 of Polysilicon is then etched using anisotropic etching. The resultant structure is shown in FIG. 1g in which sublithographic openings are created in the layer 18 of silicon nitride and the layer 16 of Polysilicon. The resultant structure is shown in FIG. 1g.

Thereafter, the masking layer of silicon (di)oxide 20 can be removed as well as the silicon nitride layer 18 can be removed, resulting in the first layer 16 of Polysilicon with sublithographic openings 24.

Figure 2A:
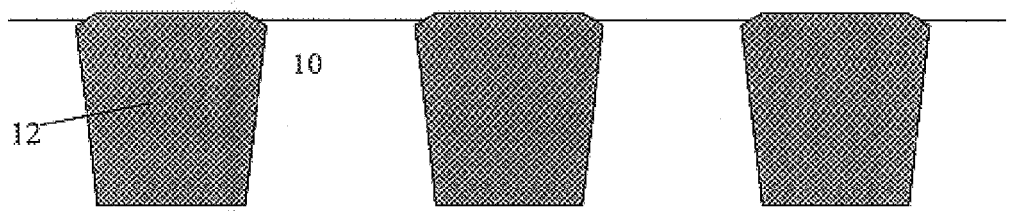
FIGS. 2a–2f are cross-sectional views of another method of the present invention to form a sublithographic opening in a first layer of a first material in a semiconductor process.

Referring to FIG. 2a, there is shown a cross-sectional view of the first step in another method of creating a sublithographic opening in a material in a semiconductor process. Similar to the cross-sectional view shown in FIG. 1a, the process begins with a semiconductor substrate of single crystalline silicon 10 with trench isolations 12. Again, however, the use of trench isolations 12 is only for illustration purposes as the FIGS. 2a–2f show the process of creating a floating gate of Polysilicon in a structure overlying shallow trench isolation 12 regions. However, the method of present invention is not so limited and can be used to create sublithographic openings in any material in a semiconductor process for any purpose.

A first layer of silicon (di)oxide 14 is then deposited on the surface of the substrate 10. This can be a layer on the order of 50 angstroms and can be made by well known conventional techniques such as chemical vapor deposition or high temperature thermal deposition. The resultant structure is shown in FIG. 2b.

Figure 2B:
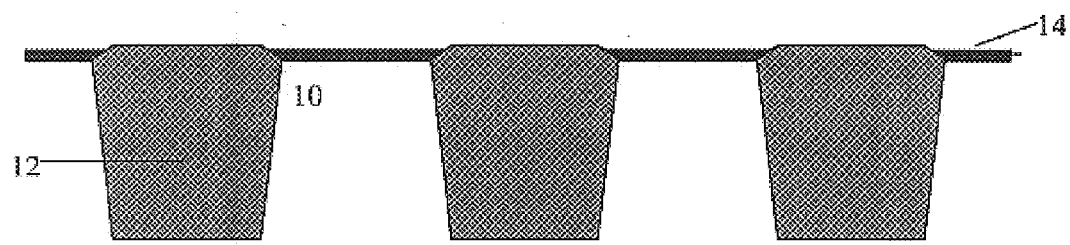
Figure 2C:
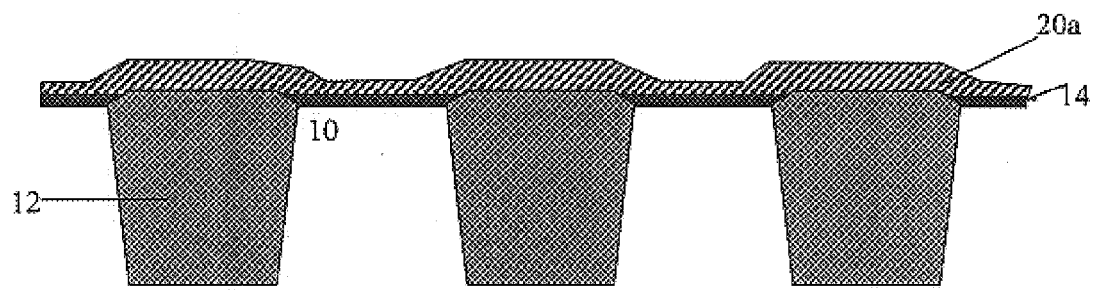

A first layer 20a of Polysilicon is then conformally deposited over the contour of the structure shown in FIG. 2b. The first layer of Polysilicon 20a can be deposited by conventional techniques such as chemical Vapor Deposition and may be deposited to a thickness of 1000 angstroms. The resultant structure is shown in FIG. 2c.

Figure 2D:
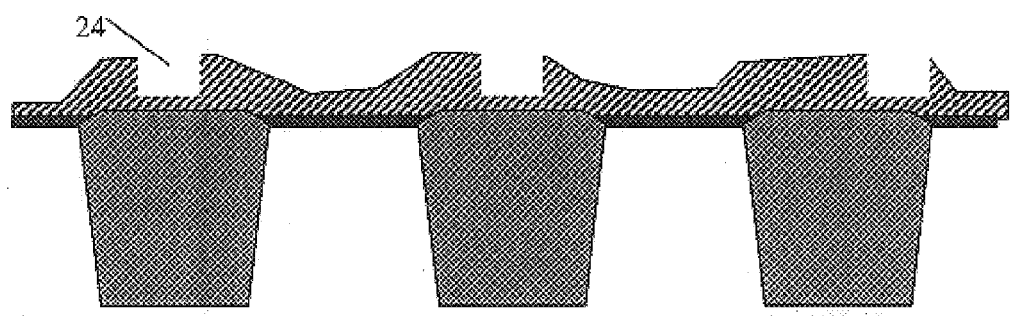

Using conventional photoresist 22 (as shown in FIGS. 1c and 1d), a lithographic opening 24 is created in the first layer 20a of Polysilicon. However, the first layer of Polysilicon 20a is not completely removed or etched from the lithographic opening 24. In the preferred embodiment, about 90% of the thickness of the Polysilicon 20a is removed from the opening 24. The process of creating a lithographic opening 24 in the first Polysilicon layer 20a results in residual Polysilicon in the lithographic opening 24, as shown in FIG. 2d.

Figure 2E:
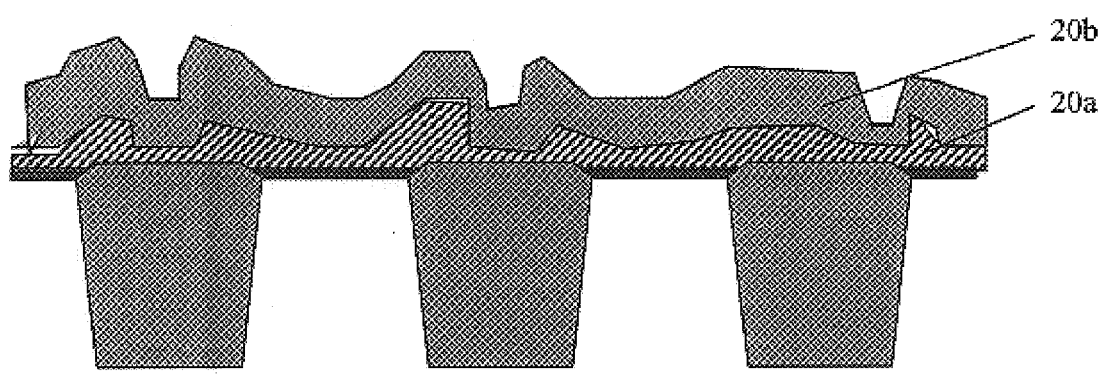
Figure 2F:
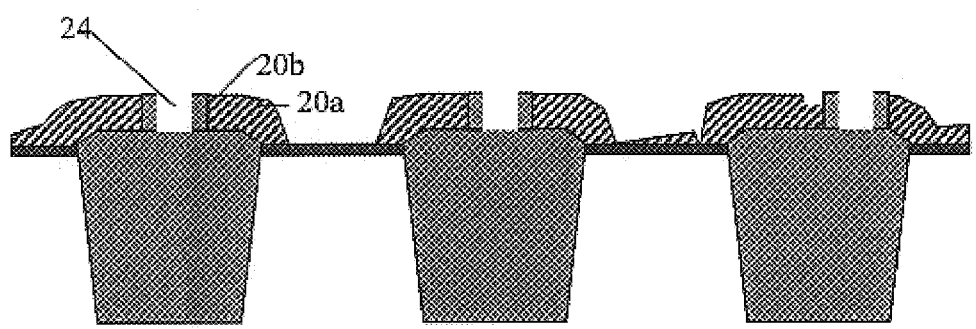

A second layer 20b of Polysilicon, which is the same material as the first layer 20a, is then conformally deposited to the contour of the first layer 20a of Polysilicon. The second layer 20b of Polysilicon is on the order of 450 angstroms and may be deposited by Chemical Vapor Deposition. The result of the deposition process is the structure shown in FIG. 2e. Thereafter, the structure shown in FIG. 2e is anisotropically etched until all of the Polysilicon is etched from the opening 24. This etching process causes the removal of the Polysilicon 20a as well as the Polysilicon from the second layer 20b that were deposited in the lithographic opening 24. However, an amount of Polysilicon 20b continues to line the sidewalls of the opening 24 to create a sublithographic opening 24. The resultant structure is shown in FIG. 2f.

What is claimed is:

1. A method of forming a sublithographic opening in a first layer of a first material in a semiconductor process, said method comprising:

creating a lithographic opening on said first layer, said lithographic opening being over the location of the desired sublithographic opening;

partially removing said first material in said lithographic opening;

depositing a sacrificial layer conformally to the contour of said first layer over said first layer including over said lithographic opening; said sacrificial layer being of said first material; and anistropically etching said sacrificial layer and said first layer in a single step to form said sublithographic opening within said lithographic opening.

2. The method of claim 1 wherein said creating step further comprises:

depositing a layer of photoresist on said first layer;

exposing said layer of photoresist to form a latent image comprising a latent lithographic opening over the location of the desired sublithographic opening; and removing completely said photoresist in said lithographic opening, thereby exposing said first layer.

3. The method of claim 2 further comprising:

removing all of said photoresist, after said partially removing and prior to said depositing of said sacrificial layer.

4. The method of claim 3 wherein said first material is polysilicon or amorphous silicon.

5. A method of forming a sublithographic opening in a first layer of a first material in a semiconductor process, said method comprising:

depositing a sacrificial layer of a first sacrificial material on said first layer;

creating a lithographic opening on said sacrificial layer, said lithographic opening positioned over the location of the desired sublithographic opening;

removing said first sacrificial material in said lithographic opening;

laterally expanding said first sacrificial material by converting said first sacrificial material to a second sacrificial material after the removing, thereby decreasing the size of said lithographic opening to a sublithographic opening; and etching said first layer using said second sacrificial material as a masking layer to form said sublithographic opening in said first layer.

6. The method of claim 5 wherein said creating step further comprises:

depositing a layer of photoresist on said sacrificial layer;

exposing said layer of photoresist to form a latent image comprising a latent lithographic opening over the location of the desired sublithographic opening; and removing said photoresist in said lithographic opening thereby exposing said sacrificial layer.

7. The method of claim 6 further comprising:

removing all of said photoresist after said removing and prior to said expanding.

8. The method of claim 7 wherein said first sacrificial material is silicon, polysilicon or amorphous silicon.

9. The method of claim 8 wherein said expanding step comprises oxidizing said first sacrificial material to produce silicon (di)oxide.

10. The method of claim 9 wherein said first layer is a composite layer comprising of a layer of polysilicon and a layer of silicon nitride with said silicon nitride immediately adjacent to said sacrificial layer.

* * * * *